(12) United States Patent
Chung et al.

(10) Patent No.: US 8,274,069 B2
(45) Date of Patent: Sep. 25, 2012

(54) NITRIDE SEMICONDUCTOR LIGHT EMITTING DEVICE

(75) Inventors: Hun Jae Chung, Gyunggi-do (KR);
Cheol Soo Sone, Gyunggi-do (KR);
Sung Hwan Jang, Gyunggi-do (KR);
Rak Jun Choi, Gyunggi-do (KR); Soo Min Lee, Seoul (KR)

(73) Assignee: Samsung Electronics Co., Ltd., Seoul (KR)

( * ) Notice: Subject to any disclaimer, the term of this patent is extended or adjusted under 35 U.S.C. 154(b) by 0 days.

(21) Appl. No.: 12/333,531

(22) Filed: Dec. 12, 2008

(65) Prior Publication Data

US 2009/0278113 A1    Nov. 12, 2009

(30) Foreign Application Priority Data

May 9, 2008    (KR) .................. 10-2008-0043638

(51) Int. Cl.
*H01L 33/00*    (2010.01)
(52) U.S. Cl. ............... 257/13; 257/14; 257/15; 257/22; 257/79; 257/103; 257/E33.008; 257/E33.033; 257/E33.034
(58) Field of Classification Search .............. 257/22, 257/79, 103, E33.008, E33.034, E33.031, 257/E33.033, E33.023, 13–15
See application file for complete search history.

(56) References Cited

U.S. PATENT DOCUMENTS

| | | | |
|---|---|---|---|
| 5,737,350 A | | 4/1998 | Motoda et al. |
| 5,959,307 A | * | 9/1999 | Nakamura et al. ............... 257/14 |
| 2007/0085097 A1 | * | 4/2007 | Kim et al. ........................ 257/94 |
| 2007/0145406 A1 | * | 6/2007 | Han et al. ....................... 257/103 |
| 2007/0297476 A1 | | 12/2007 | Ito et al. |
| 2008/0093610 A1 | | 4/2008 | Lee |

FOREIGN PATENT DOCUMENTS

| | | |
|---|---|---|
| JP | 10-065271 | 3/1998 |
| JP | 10-084132 | 3/1998 |
| JP | 2007-116147 | 5/2007 |
| JP | 2007-214221 | 8/2007 |
| JP | 2008-511153 | 4/2008 |
| KR | 10-0482511 B1 | 4/2005 |
| KR | 10-2006-0019043 | 3/2006 |
| KR | 10-0703096 B1 | 3/2007 |

OTHER PUBLICATIONS

Korean Office Action, with English translation, issued in Korean Patent Application No. 10-2008-0043638, mailed Mar. 18, 2010.

(Continued)

*Primary Examiner* — Lynne Gurley
*Assistant Examiner* — Naima Kearney
(74) *Attorney, Agent, or Firm* — McDermott Will & Emery LLP

(57) ABSTRACT

There is provided a nitride semiconductor light emitting device. A nitride semiconductor light emitting device according to an aspect of the invention may include: an n-type nitride semiconductor layer provided on a substrate; an active layer provided on the n-type nitride semiconductor layer, and including quantum barrier layers and quantum well layers; and a p-type nitride semiconductor layer provided on the active layer, wherein each of the quantum barrier layers includes a plurality of $In_xGa_{(1-x)}N$ layers (0<x<1) and at least one $Al_yGa_{(1-y)}N$ layer (0≦y<1), and the $Al_yGa_{(1-y)}N$ layer is stacked between the $In_xGa_{(1-x)}N$ layers.

4 Claims, 6 Drawing Sheets

OTHER PUBLICATIONS

Korean Office Action, with English translation, issued in Korean Patent Application No. 10-2008-0043638, mailed Sep. 6, 2010.

Japanese Office Action, w/ English translation thereof, issued in Japanese Patent Application No. JP 2008-312477 dated Aug. 16, 2011.

Taiwanese Office Action, and English translation thereof, issued in Taiwanese Patent Application No. 097147770, dated Jun. 20, 2012.

Japanese Office Action, and English translation thereof, issued in Japanese Patent Application No. 2008-312477 dated May 15, 2012.

* cited by examiner

NITRIDE SEMICONDUCTOR LIGHT EMITTING DEVICE

CROSS-REFERENCE TO RELATED APPLICATIONS

This application claims the priority of Korean Patent Application No. 2008-0043638 filed on May 9, 2008, in the Korean Intellectual Property Office, the disclosure of which is incorporated herein by reference.

BACKGROUND OF THE INVENTION

1. Field of the Invention

The present invention relates to nitride semiconductor light emitting devices, and more particularly, to a nitride semiconductor light emitting device that improves light emitting efficiency.

2. Description of the Related Art

Recently, group III nitride semiconductors (simply referred to as "nitride semiconductors") are widely used to manufacture light emitting devices that generate ultraviolet (UV) light, blue light, and green light in various apparatuses such as LCD backlights, camera flashes, and lighting equipment. In general, a nitride semiconductor has a composition represented by equation: $Al_xGa_yIn_{1-x-y}N$ ($0 \leq x \leq 1$, $0 \leq y \leq 1$, and $0 \leq x+y \leq 1$). In order to manufacture nitride semiconductor light emitting devices (including LEDs and the like), an n-type nitride semiconductor layer, an active layer, and a p-type nitride semiconductor layer are sequentially grown on a growth substrate, such as a sapphire substrate, so as to form a light emitting structure. Here, the active layer may include quantum well layers and quantum barrier layers.

FIG. 1 is an energy band diagram of a nitride semiconductor light emitting device according to the related art. Referring to FIG. 1, a nitride semiconductor light emitting device includes an active layer 12 that has InGaN quantum well layers 12a and GaN quantum barrier layers 12b between an n-type nitride semiconductor layer 11 and a p-type nitride semiconductor layer 13. Here, light is emitted as electrons supplied from the n-type nitride semiconductor layer 11 and holes supplied from the p-type nitride semiconductor 13 are recombined in the active layer 12. In order to improve the recombination of the electrons and the holes in the active layer, there needs to be considerable overlap between a wave function of the electrons and a wave function of the holes. However, a piezoelectric field occurs within the quantum well layers due to a lattice constant mismatch at the interface between the InGaN quantum well layers 12a and the GaN quantum barrier layers 12b. As a result, the overlap between the wave function of the electrons and the wave function of the holes is reduced because the wave function of the electrons and the wave function of the holes become distanced. Therefore, a chronic problem, that is, a decrease in recombination efficiency occurs in the active layer of the nitride semiconductor light emitting device.

In order to solve this, a technique that uses an AlInGaN quantum barrier layer having a similar lattice constant with the InGaN quantum well layers 12a and a similar energy band gap with the quantum barrier layers has been developed. However, when the AlInGaN quantum barrier layer is grown, optimal penetration of Al atoms may be allowed at a temperature of 800° C. or more and a pressure of 199 Torr, and optimal penetration of In atoms may be allowed at a temperature of less than 800° C. and a pressure of approximately 300 Torr. That is, since processing conditions for the optimal penetration of the Al atoms and the In atoms are different from each other, it is difficult to grow an AlInGaN quantum barrier layer having excellent crystalline quality.

SUMMARY OF THE INVENTION

An aspect of the present invention provides a nitride semiconductor light emitting device that reduces lattice constant mismatch between a quantum well layer formed of InGaN and a quantum barrier layer and has a high energy band gap by alternating a plurality of AlGaN layers and a plurality of InGaN layers with each other, starting and ending with the InGaN layer, or by alternating GaN layer and InGaN layers with each other, starting and ending with the InGaN layer, so as to form a quantum barrier layer.

An aspect of the present invention also provides a nitride semiconductor light emitting device that can reduce lattice constant mismatch between an InGaN layer and AlGaN layer by alternating a plurality of InGaN layers and AlGaN layers with each other, starting and ending with the InGaN layer, and stacking a GaN layer between the InGaN layer and the AlGaN layer.

According to an aspect of the present invention, there is provided a nitride semiconductor light emitting device including: an n-type nitride semiconductor layer provided on a substrate; an active layer provided on the n-type nitride semiconductor layer, and including quantum barrier layers and quantum well layers; and a p-type nitride semiconductor layer provided on the active layer, wherein each of the quantum barrier layers includes a plurality of $In_xGa_{(1-x)}N$ layers ($0<x<1$) and at least one $Al_yGa_{(1-y)}N$ layer ($0 \leq y<1$), and the $Al_yGa_{(1-y)}N$ layer is stacked between the $In_xGa_{(1-x)}N$ layers.

The plurality of quantum well layers may be formed of $In_zGa_{(1-z)}N$ ($0<x<z<1$).

Each of the $In_xGa_{(1-x)}N$ layer and $Al_yGa_{(1-y)}N$ layer forming the quantum barrier layer may have a thickness of 0.5 to 10 nm.

The plurality of $In_xGa_{(1-x)}N$ layers may have an energy band gap larger than the quantum well layer and smaller than the at least $Al_yGa_{(1-y)}N$ layer.

The quantum barrier layer may include a super lattice structure having the $Al_yGa_{(1-y)}N$ layer stacked between the $In_xGa_{(1-x)}N$ layers, and having at least two stacks of $In_xGa_{(1-x)}N$ layers and $Al_yGa_{(1-y)}N$ layers alternating with each other, starting and ending with the $In_xGa_{(1-x)}N$ layer.

Each of the $In_xGa_{(1-x)}N$ layers and the $Al_yGa_{(1-y)}N$ layers forming the quantum barrier layer may have a thickness of 0.3 to 3 nm.

The quantum barrier layer may further include a GaN layer provided between the $In_xGa_{(1-x)}N$ layer and $Al_yGa_{(1-y)}N$ layer.

The plurality of $In_xGa_{(1-x)}N$ layers may have an energy band gap larger than the quantum well layer and smaller than the GaN layer, and the GaN layer may have a smaller energy band gap than the $Al_yGa_{(1-y)}N$ layer.

Each of the $In_xGa_{(1-x)}N$ layer, the $Al_yGa_{(1-y)}N$ layer, and the GaN layer forming the quantum barrier layer may have a thickness of 0.5 to 10 nm.

The quantum barrier layer may have a thickness of 2 to 15 nm.

The quantum well layer may have a thickness of 1 to 15 nm.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
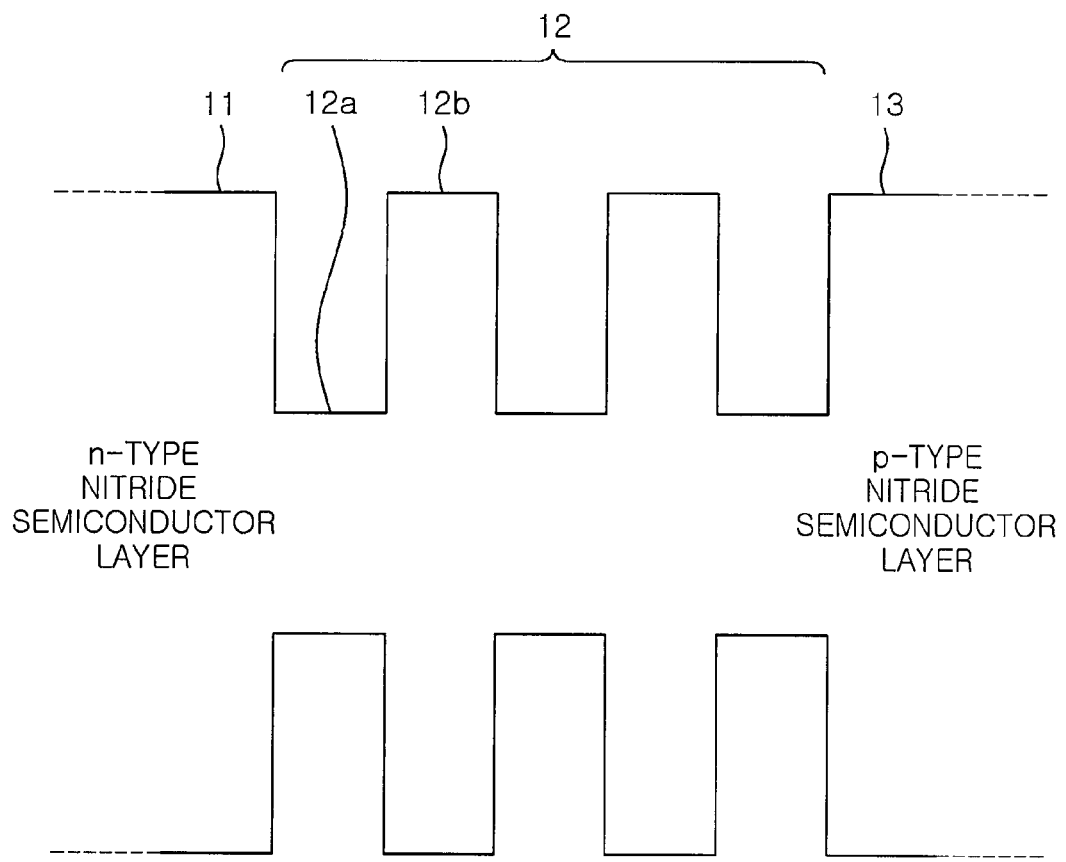
FIG. 1 is a graph illustrating an energy band diagram of a nitride semiconductor light emitting device according to the related art.
Figure 2:
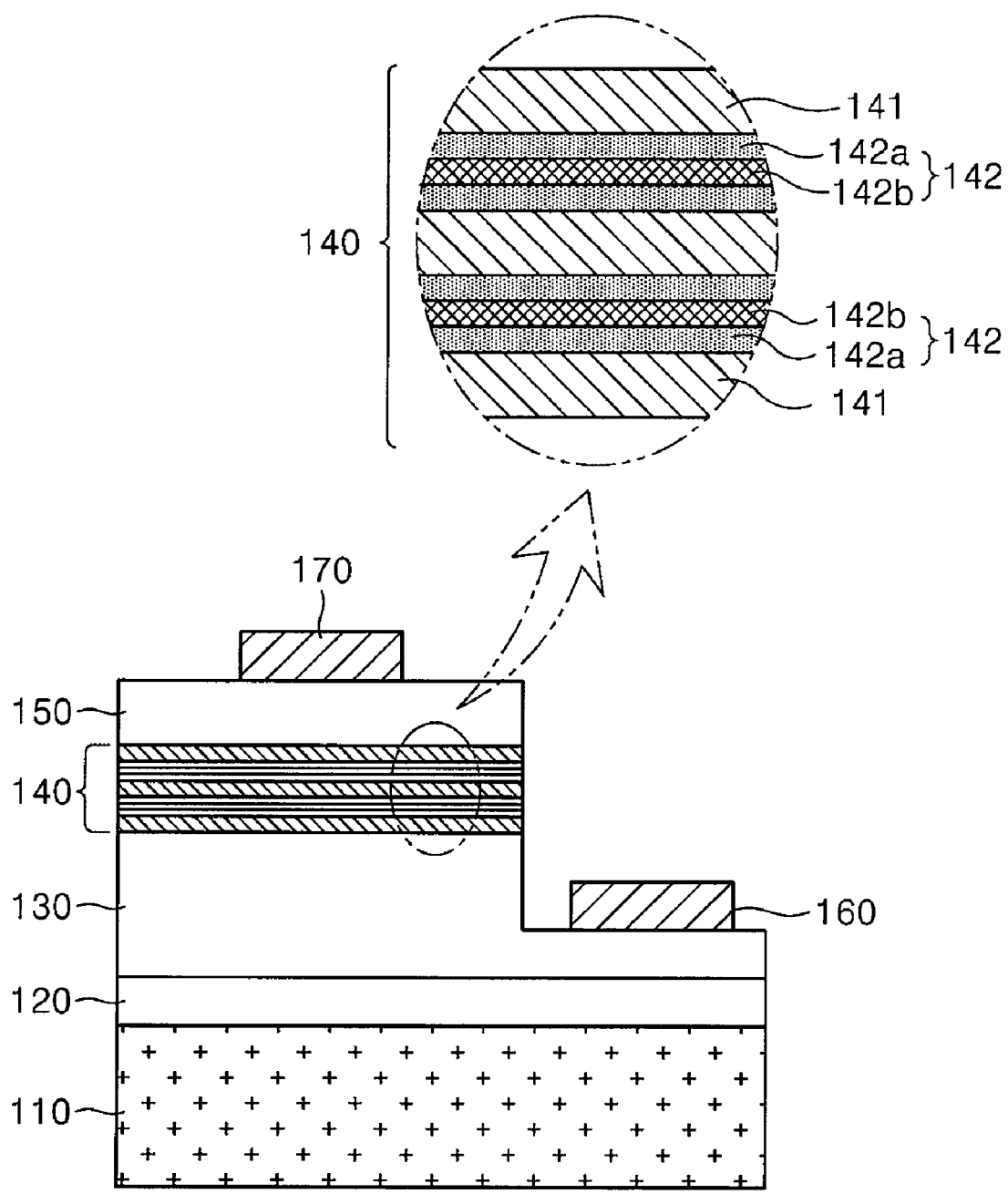
FIG. 2 is a view illustrating a nitride semiconductor light emitting device according to an exemplary embodiment of the invention.

FIG. 2 is a view illustrating a nitride semiconductor light emitting device according to an exemplary embodiment of the invention. Referring to FIG. 2, a nitride semiconductor light emitting device includes a buffer layer 120 formed on a substrate 110, an n-type nitride semiconductor layer 130 formed on the buffer layer 120, an active layer 140 formed on the n-type nitride semiconductor layer 130, a p-type nitride semiconductor layer 150 formed on the active layer 140, an n-electrode 160 formed on the n-type nitride semiconductor layer 130 having a mesa structure, and a p-electrode 170 formed on the p-type nitride semiconductor layer 150.

In general, a sapphire substrate is used as the substrate 110, the buffer layer 120 may be formed of undoped GaN, AlN or SiN in order to reduce a lattice constant mismatch between the sapphire substrate and the n-type nitride semiconductor layer 130.

The n-type nitride semiconductor layer 130 may be formed of GaN doped with an n-type impurity, and the p-type nitride semiconductor layer 150 may be formed of GaN doped with a p-type impurity. The active layer 140 having a multiple quantum well structure is located between the n-type nitride semiconductor layer 130 and the p-type nitride semiconductor layer 150. Specifically, referring to an enlarged view illustrating a part of the active layer 140, the active layer 140 includes a plurality of quantum well layers 141, and a plurality of quantum barrier layers 142 formed between the plurality of quantum well layers 141.

The plurality of quantum well layers 141 may be formed of $In_zGa_{(1-z)}N$ (0<z<1), and may have a thickness of approximately 1 to 15M. Further, each of the plurality of the quantum barrier layer 142 includes a plurality of $In_xGa_{(1-x)}N$ layers (0<x<1) 142a and one $Al_yGa_{(1-y)}N$ layer (0≦y<1) 142b. Here, the $Al_yGa_{(1-y)}N$ layer 142b is formed between the $In_xGa_{(1-x)}N$ layers 142a. The active layer 140 has a multilayer structure of $In_xGa_{(1-x)}N$ layer/$Al_yGa_{(1-y)}N$ layer/$In_xGa_{(1-x)}N$ layer.

The $In_xGa_{(1-x)}N$ layers 142a and the $Al_yGa_{(1-y)}N$ layer 142b that form the quantum barrier layer 142 may be separately grown by individual processes. Specifically, the $In_xGa_{(1-x)}N$ layer 142a may be grown by such a method that In atoms penetrate into a GaN layer at a temperature of 800° C. or less and a pressure of approximately 300 Torr. Further, the $Al_yGa_{(1-y)}N$ layer 142b may be grown by such a method that Al atoms penetrate into a GaN layer at a temperature of 800° C. or more and a pressure of 100 Torr. The $In_xGa_{(1-x)}N$ layer 142a and the $Al_yGa_{(1-y)}N$ layer 142b are separately grown by using the individual processes, thereby forming the quantum barrier layer 142, shown in FIG. 2. Each of the $In_xGa_{(1-x)}N$ layers 142a and the $Al_yGa_{(1-y)}N$ layer 142b that form the quantum barrier layer 142 may have a thickness of approximately 0.5 to 10M.

Further, the $In_xGa_{(1-x)}N$ layer 142a of the quantum barrier layer 142 is formed of the same material as $In_zGa_{(1-z)}N$ (0<z<1) that forms the quantum well layer 141, so that the lattice constant mismatch at the interface between the quantum well layer 141 and the quantum barrier layer 142 can be significantly reduced. In order to modulate a energy band gap of the $In_xGa_{(1-x)}N$ layers 142a of the quantum barrier layer 142, that is, in order to obtain an energy band gap that is larger than that of the quantum well layer 141, an In composition x In of the $In_xGa_{(1-x)}N$ layer 142a may be less than an In composition (z) of the $In_zGa_{(1-z)}N$ (0<z<1). That is, the relationship of the In composition x between the $In_xGa_{(1-x)}N$ layer 142a and the $In_zGa_{(1-z)}N$ (0<z<1) may be 0<x<z<1.

The quantum barrier layer 142, shown in FIG. 2, reduces the lattice constant mismatch between the quantum barrier layer 142 and the quantum well layer 141 by the $In_xGa_{(1-x)}N$ layer 142a, thereby reducing generation of a piezoelectric field. Therefore, the overlap between wave functions of electrons and holes is increased to thereby increase light-emitting efficiency. Further, the energy band gap is increased by the $Al_yGa_{(1-y)}N$ layer 142b that forms the quantum barrier layer 142 to thereby effectively confine electrons within the quantum well layer 141.

Figure 3:
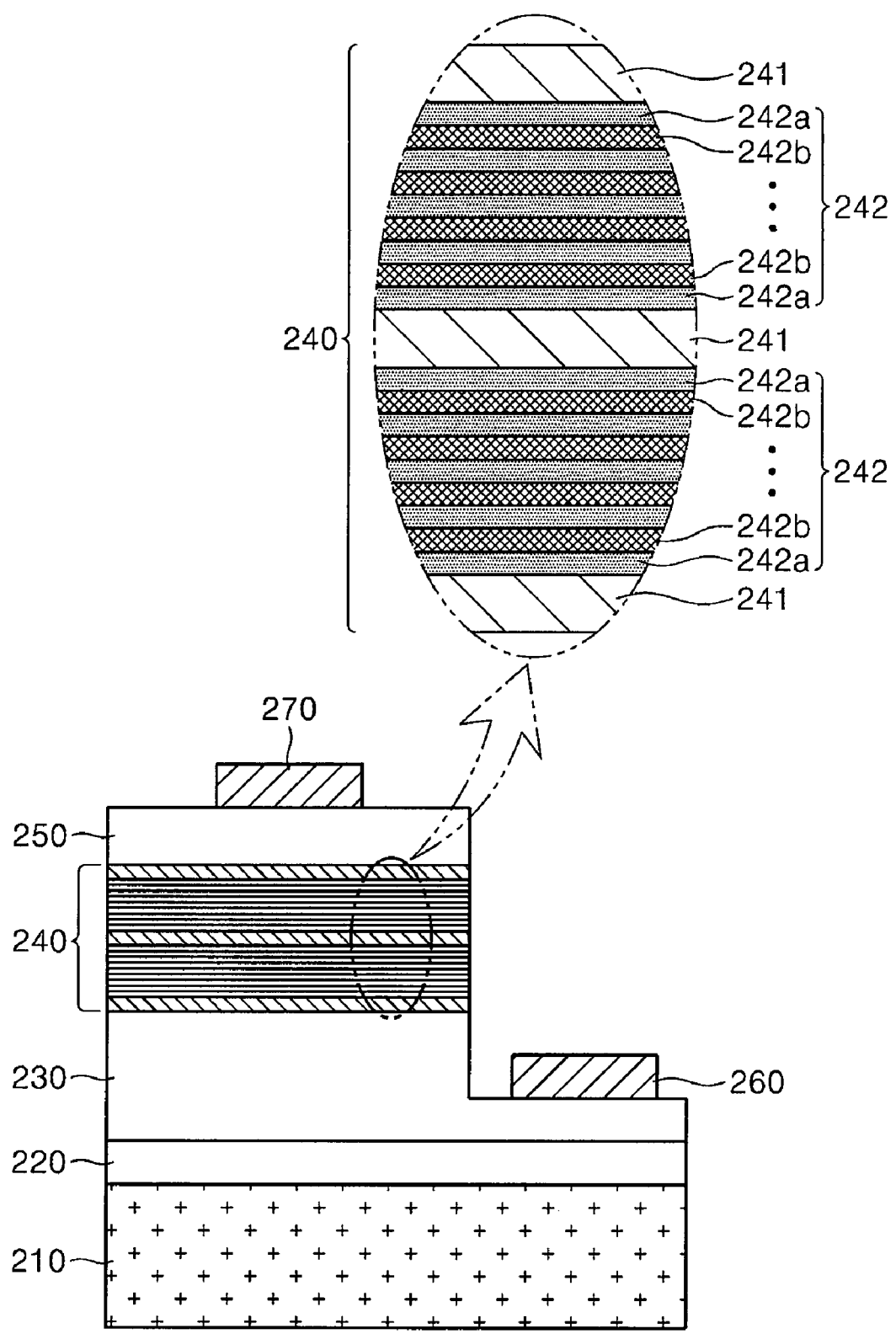
FIG. 3 is a view illustrating a nitride semiconductor light emitting device according to another exemplary embodiment of the invention.

FIG. 3 is a view illustrating a nitride semiconductor light emitting device according to another exemplary embodiment of the invention. Referring to FIG. 3, the nitride semiconductor light emitting device includes a buffer layer 220 formed on a substrate 210, an n-type nitride semiconductor layer 230 formed on the buffer layer 220, an active layer 240 formed on the n-type nitride semiconductor layer 230, a p-type nitride semiconductor layer 250 formed on the active layer 240, an n-electrode 260 formed on the n-type nitride semiconductor layer 230 having a mesa structure, and a p-electrode 270 formed on the p-type nitride semiconductor layer 250.

The active layer 240 having a multiple quantum well structure is located between the n-type nitride semiconductor layer 230 and the p-type nitride semiconductor layer 250. Specifically, referring to an enlarged view illustrating a part of the active layer 240, the active layer 240 includes a plurality of quantum well layers 241, and a plurality of quantum barrier layer 242 formed between the plurality of quantum well layers 241.

The plurality of quantum well layers 241 may be formed of $In_zGa_{(1-z)}N$ (0<z<1), and have a thickness of approximately 1 to 15 nm. Further, each of the plurality of quantum barrier layers 242 includes a plurality of $In_xGa_{(1-x)}N$ layers (0<x<1) 242a and a plurality of $Al_yGa_{(1-y)}N$ layers (0≦y<1) 242b. In this case, the $Al_yGa_{(1-y)}N$ layers 242b are formed between the $In_xGa_{(1-x)}N$ layers 242a. The quantum barrier layer 242 has a structure in which the $In_xGa_{(1-x)}N$ layers 242a and the $Al_yGa_{(1-y)}N$ layers 242b alternate with each other. Here, as shown in the enlarged view of the active layer 240 in FIG. 3, the $In_xGa_{(1-x)}N$ and $Al_yGa_{(1-y)}N$ layers 242a and 242b may be arranged in alternate layers, starting and ending with the $In_xGa_{(1-x)}N$ layers 242a in one quantum barrier layer 242.

One quantum barrier layer 242 having this structure has a thickness of approximately 2 to 15 nm.

The $In_xGa_{(1-x)}N$ layers 242a and the $Al_yGa_{(1-y)}N$ layers 242b that form the quantum barrier layer 242 may be separately grown by individual processes. In this case, the $In_xGa_{(1-x)}N$ layer 242a and the $Al_yGa_{(1-y)}N$ layer 242b may be grown by using the same method of growing the $In_xGa_{(1-x)}N$ layer 142a and $Al_yGa_{(1-y)}N$ layer 142b as shown in FIG. 2. In this case, each of the $In_xGa_{(1-x)}N$ layers 242a and the $Al_yGa_{(1-y)}N$ layers 242b that form the quantum barrier layer 242 may have a thickness of approximately 0.3 to 3 nm, that is, each layer may have a super lattice structure.

Further, in order to modulate the energy band gap, the In composition x of the $In_xGa_{(1-x)}N$ layer 242a of the quantum barrier layer 242 is reduced less than the In composition z of $In_zGa_{(1-z)}N$ (0<z<1).

The quantum barrier layer 242, shown in FIG. 3, reduces the lattice constant mismatch between the quantum well layer 241 and the quantum barrier layer 242 by the $In_xGa_{(1-x)}N$ layer 242a, thereby reducing generation of a piezoelectric field. This causes an increase in overlap between wave functions of electrons and holes, thereby increasing the light emitting efficiency. Further, the energy band gap is increased by the $Al_yGa_{(1-y)}N$ layer 242b that forms the quantum barrier layer 242, so that the electrons can be effectively confined within the quantum well layer 241. Since the $In_xGa_{(1-x)}N$ layer 242a and the $Al_yGa_{(1-y)}N$ layer 242b that are separately grown by using the individual processes super lattice structures, and can substantially serve as an $Al_yIn_xGaN_{(1-x-y)}$ layer.

By controlling an Al composition y of each of the $Al_yGa_{(1-y)}N$ layers 141b and 242b of the quantum barrier layers 142 and 242 of the nitride semiconductor light emitting device, shown in FIGS. 2 and 3, a quantum barrier layer can be formed in which a GaN layer is stacked between the plurality of $In_xGa_{(1-x)}N$ layers 142a and the plurality of $In_xGa_{(1-x)}N$ layers 242a. Specifically, when the Al composition y is 0, the $Al_yGa_{(1-y)}N$ layers 141b and 242b can be formed as GaN layers. Here, the $In_xGa_{(1-x)}N$ layers 142a and 242a and the GaN layers may have super lattice structures. Therefore, the quantum barrier layers 142 and 242 reduce the lattice constant mismatches between the quantum barrier layers 142 and 242 and the quantum well layers 141 and 241, respectively, thereby reducing generation of the piezoelectric field.

Figure 4:
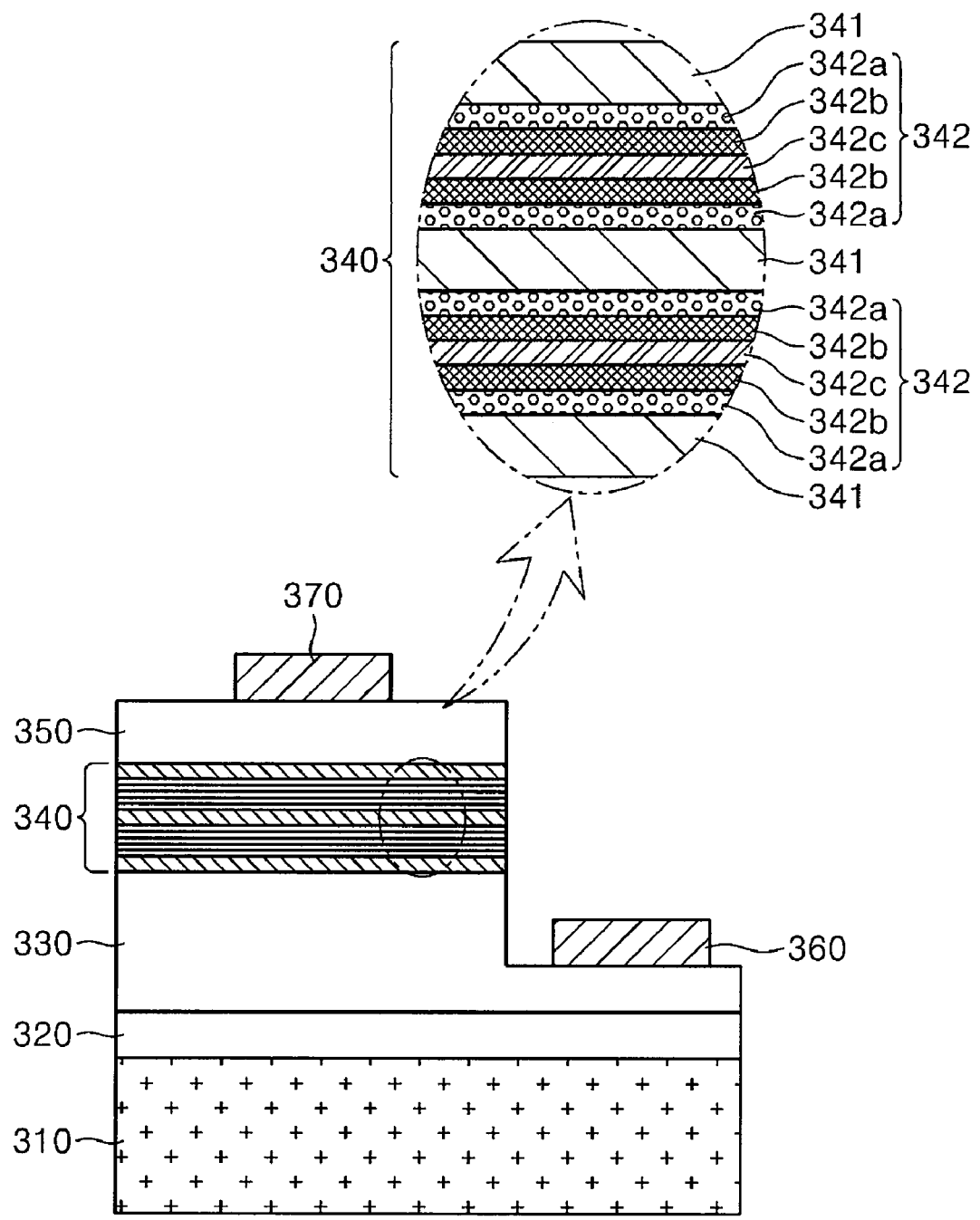
FIG. 4 is a view illustrating a nitride semiconductor light emitting device according to still another exemplary embodiment of the invention.

FIG. 4 is a view illustrating a nitride semiconductor light emitting device according to still another exemplary embodiment. Referring to FIG. 4, a nitride semiconductor light emitting device 300 includes a buffer layer 320 formed on a substrate 310, an n-type nitride semiconductor layer 330 formed on the buffer layer 320, an active layer 340 formed on the n-type nitride semiconductor layer 330, a p-type nitride semiconductor layer 350 formed on the active layer 340, an n-electrode 360 formed on the n-type nitride semiconductor layer 330 having a mesa structure, and a p-electrode 370 formed on the p-type nitride semiconductor layer 350.

The active layer 340 having a multi-well structure is located between the n-type nitride semiconductor layer 330 and the p-type nitride semiconductor layer 350. Specifically, referring to an enlarged view illustrating a part of the active layer 340, the active layer 340 includes a plurality of quantum well layers 341, and a plurality of quantum well layers 342 formed between the plurality of quantum well layer 341. Here, the quantum well layers 341 and the quantum well layers 342 alternate with each other. In this case, the quantum well layer 341 may be formed of $In_zGa_{(1-z)}N$ (0<z<1), and have a thickness of approximately 1 to 15 nm.

Each of the quantum barrier layers 342 includes a plurality of $In_xGa_{(1-x)}N$ layers (0<x<1) 342a, a plurality of GaN layers 342b, and at least one $Al_yGa_{(1-y)}N$ layer (0≦y<1) 342c. Here, the $Al_yGa_{(1-y)}N$ layer 342c is formed between the plurality of $In_xGa_{(1-x)}N$ layers 342a, and the GaN layer 342b is formed between the $In_xGa_{(1-x)}N$ layer 342a and the $Al_yGa_{(1-y)}N$ layer 342c. The quantum barrier layer 342 has a multilayer structure of the $In_xGa_{(1-x)}N$ layer/GaN layer/$Al_yGa_{(1-y)}N$ layer/GaN layer/$In_xGa_{(1-x)}N$ layer that includes at least five layers. One quantum barrier layer 342 has a thickness of approximately 2 to 15 nm.

The $In_xGa_{(1-x)}N$ layer 342a, the GaN layer 342b, and the $Al_yGa_{(1-y)}N$ layer 342c that form the quantum barrier layer 342 are separately grown by individual processes, so that each of the layers can ensure crystalline quality. In this case, the $In_xGa_{(1-x)}N$ layer 342a and the $Al_yGa_{(1-y)}N$ layer 342c may be grown by the same method of forming the $In_xGa_{(1-x)}N$ layer 142a and the $Al_yGa_{(1-y)}N$ layer 142b, shown in FIG. 2. The GaN layer 342b may be grown by metal organic chemical vapor deposition (MOCVD). Here, each of the $In_xGa_{(1-x)}N$ layer 342a, the GaN layer 342b, and the $Al_yGa_{(1-y)}N$ layer 342c may have a thickness of approximately 0.5 to 10 nm.

Further, the $In_xGa_{(1-x)}N$ layer 342a and the quantum well layer 341 of the quantum barrier layer 342 are formed of the same material to thereby significantly reduce the lattice constant mismatch at the interface between the quantum well layer 341 and the quantum barrier layer 342. In this case, the In composition x of the $In_xGa_{(1-x)}N$ layer 342a is reduced less than the In composition z of the $In_zGa_{(1-z)}N$ (0<z<1) to thereby modulate the energy band gap.

The quantum barrier layer 342, shown in FIG. 4, reduces the lattice constant mismatch between the quantum well layer 341 and the quantum barrier layer 342 by the $In_xGa_{(1-x)}N$ layer 342a, thereby reducing generation of a piezoelectric field. Therefore, an increase in overlap between wave functions of electrons and holes causes an increase in light-emitting efficiency. Further, the energy band gap is increased by the $Al_yGa_{(1-y)}N$ layer 342c that forms the quantum barrier layer 342, so that the electrons can be effectively confined within the quantum well layers. Further, the lattice constant mismatch between the $In_xGa_{(1-x)}N$ layer 342a and the $Al_yGa_{(1-y)}N$ layer 342c is reduced by the GaN layer 342b that forms the quantum barrier layer 342 to thereby increase the light emitting efficiency.

Referring to FIGS. 2 to 4, the plurality of quantum well barrier layers have multilayer structures according to the embodiments of the invention. However, quantum barrier layers that are only adjacent to the p-type nitride semiconductor layer may only have the above-described multilayer structures.

Further, in FIGS. 2 to 4, the nitride semiconductor light emitting device has a horizontal structure in which each of the n-electrodes 160, 260, and 360 and each of the p-electrodes 170, 270, and 370 are disposed on the same surface. However, the invention can be applied to a nitride semiconductor light emitting device having a vertical structure.

Figure 5:
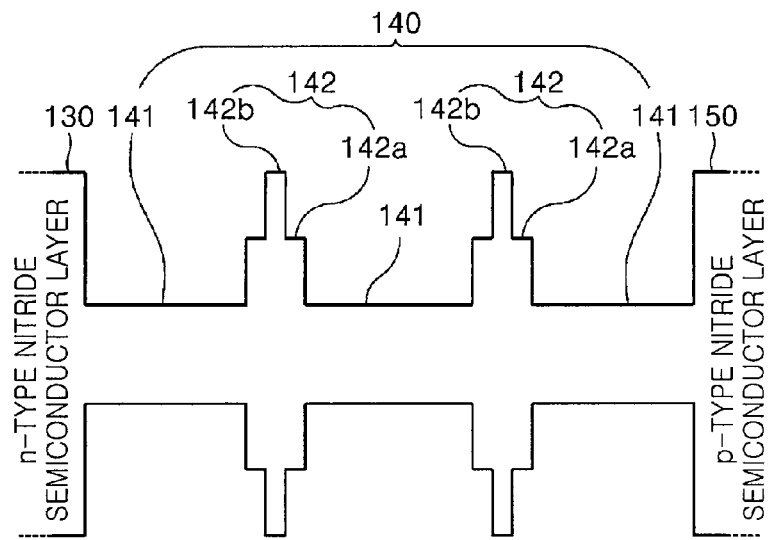
FIG. 5 is an energy band diagram of the nitride semiconductor light emitting device according to the embodiment of the invention, as shown in FIG. 2.

FIG. 5 is an energy band diagram illustrating the nitride semiconductor light emitting device according to the embodiment of the invention, shown in FIG. 2. That is, in FIG. 5, an energy band diagram of the nitride semiconductor light emitting device, shown in FIG. 2, is shown.

Referring to FIG. 5, the active layer 140 located between the n-type and p-type nitride semiconductor layers 130 and 150 includes the plurality of quantum well layers 141 and the plurality of quantum barrier layers 142. Further, the plurality of quantum well layers 141 are formed of $In_zGa_{(1-z)}N$ (0<z<1). Each of the plurality of quantum barrier layers 142 includes $In_xGa_{(1-x)}N$ layers 142a and the $Al_yGa_{(1-y)}N$ layer 142b. Here, the $In_xGa_{(1-x)}N$ layers 142a have a larger energy band gap than the quantum well layer 141 in order to reduce the lattice constant mismatch between the quantum well layer 141 and the $In_xGa_{(1-x)}N$ layers 142a, and serve as the quantum barrier layer. The $In_xGa_{(1-x)}N$ layers 142a can have a larger energy band gap by reducing the In composition x of the $In_xGa_{(1-x)}N$ layers 142a less than the In composition z of the quantum well layer 141. Since the $Al_yGa_{(1-y)}N$ layer 142b has a larger energy band gap than the $In_xGa_{(1-x)}N$ layers 142a, the electrons can be effectively confined within the quantum well layer 141. As a result, a nitride semiconductor light emitting device having the improved light emitting efficiency can be provided.

Figure 6:
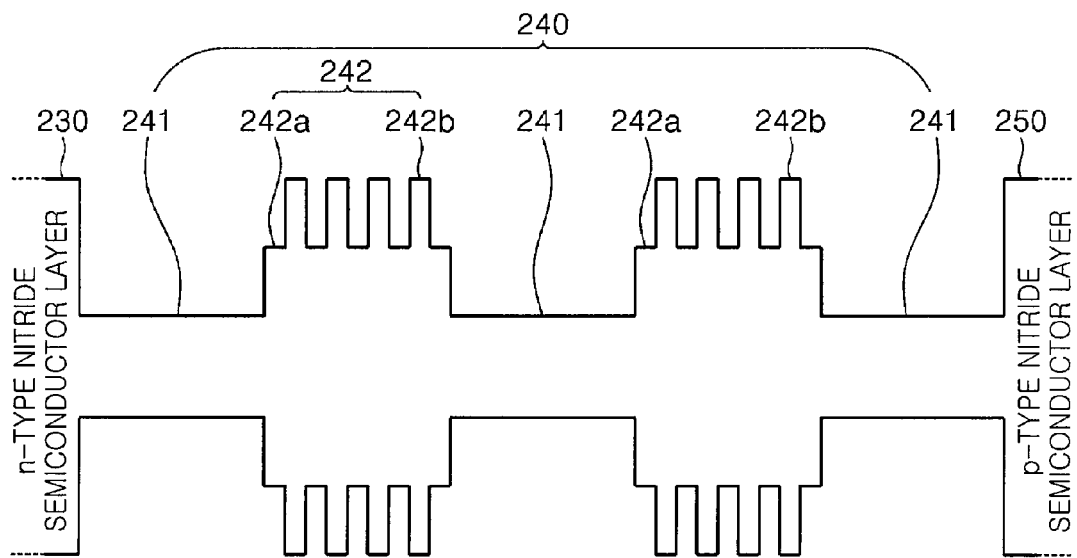
FIG. 6 is an energy band diagram of the nitride semiconductor light emitting device according to the embodiment of the invention, as shown in FIG. 3.

FIG. 6 is an energy band diagram illustrating the nitride semiconductor light emitting device according to the embodiment of the invention, shown in FIG. 3. In FIG. 6, an energy band diagram of the nitride semiconductor light emitting device, shown in FIG. 3, is shown.

Referring to FIG. 6, the active layer 240 includes the plurality of quantum well layers 241 and the plurality of quantum barrier layer 242. Further, the plurality of quantum well layers 241 are formed of $In_zGa_{(1-z)}N$ (0<z<1). Each the plurality of quantum barrier layer 242 includes $In_xGa_{(1-x)}N$ layers 242a and $Al_yGa_{(1-y)}N$ layers 242b.

In this case, the $In_xGa_{(1-x)}N$ layers 242a reduce the lattice constant mismatch between the quantum well layer 241 and the quantum barrier layer 242, and have a larger energy band gap than the quantum well layer so as to serve as a quantum barrier layer. Further, the $Al_yGa_{(1-y)}N$ layer 242b has a larger energy band gap than the $In_xGa_{(1-x)}N$ layers 242a to thereby effectively confine the electrons within the quantum well layer 241.

The $In_xGa_{(1-x)}N$ layers 242a and the $Al_yGa_{(1-y)}N$ layers 242b alternate with each other to form a super lattice structure, thereby serving as an $Al_yIn_xGaN_{(1-x-y)}$ layer. As described above, the quantum barrier layer 242 can reduce the lattice constant mismatch between the quantum well layer 241 and the quantum barrier layer 242, and have a high energy band gap.

Figure 7:
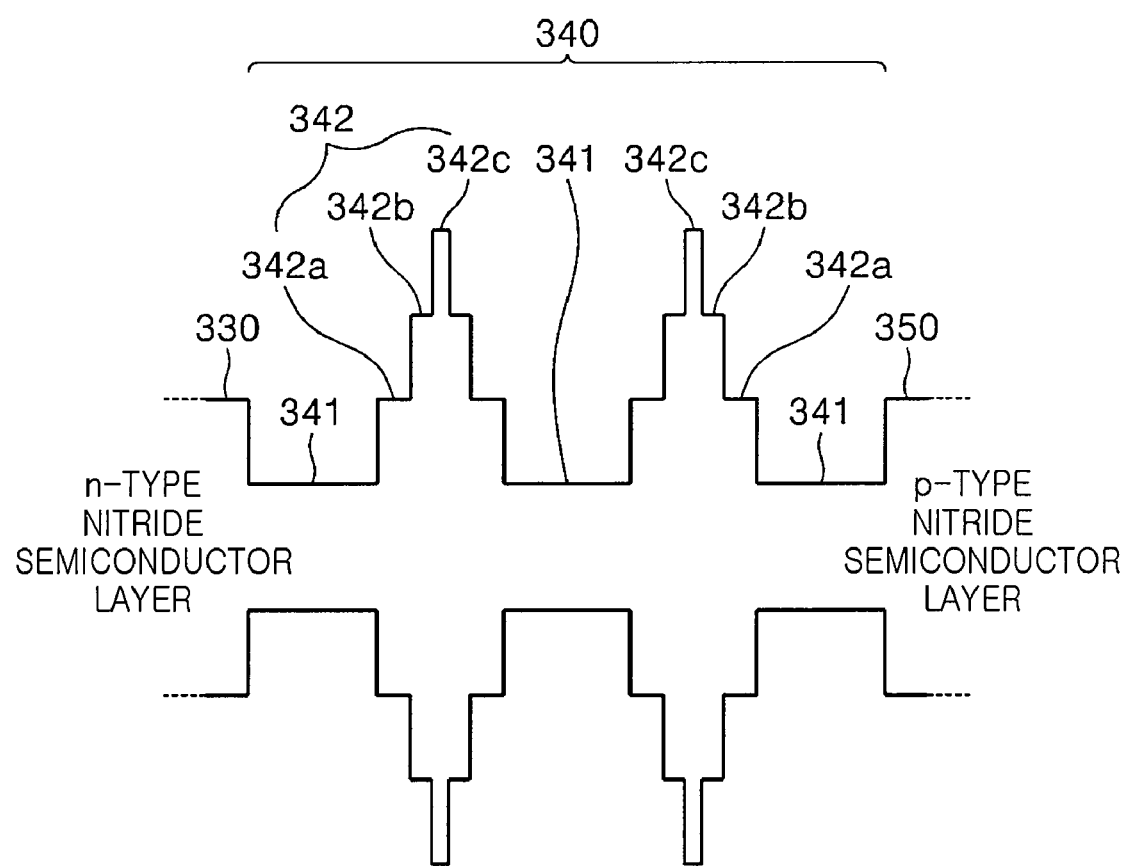
FIG. 7 is an energy band diagram of the nitride semiconductor light emitting device according to the embodiment of the invention, as shown in FIG. 4.

FIG. 7 is an energy band diagram of the nitride semiconductor light emitting device according to the embodiment of the invention, as shown in FIG. 4. That is, in FIG. 7, the energy band diagram of the nitride semiconductor light emitting device, shown in FIG. 4, is shown.

Referring to FIG. 7, the active layer 340 is located between the n-type and p-type nitride semiconductor layers 330 and 350, and the active layer 340 includes the plurality of quantum well layers 341 and the plurality of quantum barrier layers 342. Here, each of the plurality of quantum barrier layers 342 includes the $In_xGa_{(1-x)}N$ layers 342a, the GaN layers 342b, and the at least one $Al_yGa_{(1-y)}N$ layer 342c. Here, the $In_xGa_{(1-x)}N$ layers 342a have a larger energy band gap than the quantum well layer in order to reduce the lattice constant mismatch between the quantum well layer 341 and the quantum barrier layer 342, and serve as the quantum barrier layer.

Further, the GaN layers 342b reduce lattice the constant mismatch between the $In_xGa_{(1-x)}N$ layer 342a and the $Al_yGa_{(1-y)}N$ layer 342c, and have an energy band gap larger than the $In_xGa_{(1-x)}N$ layers 342a and lower than the $Al_yGa_{(1-y)}N$ layer 342c.

Further, the $Al_yGa_{(1-y)}N$ layer 342c has a larger energy band gap than the GaN layers 342b to effectively confine electrons within the quantum well layer 341. As a result, the nitride semiconductor light emitting device having improved light emitting efficiency can be provided.

In the energy band diagrams, shown in FIGS. 5 to 7, the same kind of layer, that is, the $In_xGa_{(1-x)}N$ layers 142a, 242a, and 342a and the $Al_yGa_{(1-y)}N$ layers 142b, 242b, and 342c, or the GaN layers 342b have the same energy band gap. However, the individual layers may have different energy band gaps from each other. For example, the In composition x of the each of the plurality of $In_xGa_{(1-x)}N$ layers 242a, shown in FIG. 3, may be adjusted so that the $In_xGa_{(1-x)}N$ layers 242a can have different energy band gaps. Alternatively, the Al composition y of each of the plurality of $Al_yGa_{(1-y)}N$ layers 242b, shown in FIG. 3, may be adjusted so that the $Al_yGa_{(1-y)}N$ layers 242b can have different energy band gaps.

As set forth above, according to exemplary embodiments of the invention, lattice constant mismatch between a quantum well layer formed of InGaN and a quantum barrier layer can be reduced by stacking AlGaN layers between a plurality of InGaN layers to form a quantum barrier layer or stacking GaN layers between the plurality of InGaN layers. The lattice constant mismatch at the interface between the quantum well layer and the quantum barrier layer can be reduced to thereby increase light emitting efficiency of a nitride semiconductor light emitting device.

Further, the InGaN layers and the AlGaN layers that form the quantum barrier layer are separately grown by individual processes to form a super lattice structure, such that the quantum barrier layer can serve as an AlInGaN quantum barrier layer.

Further, since the quantum barrier layer has a high energy band gap by the AlGaN layers, the quantum barrier can effectively confine electrons within the quantum well layer, thereby increasing the light emitting efficiency.

The plurality of InGaN and AlGaN layers alternate with each other, and the GaN layer is stacked between the InGaN layer and the AlGaN layer, thereby reducing the lattice constant mismatch between the InGaN layer and the AlGaN layer.

While the present invention has been shown and described in connection with the exemplary embodiments, it will be apparent to those skilled in the art that modifications and variations can be made without departing from the spirit and scope of the invention as defined by the appended claims.

What is claimed is:

1. A nitride semiconductor light emitting device comprising:
    an n-type nitride semiconductor layer provided on a substrate;
    an active layer provided on the n-type nitride semiconductor layer, and including quantum barrier layers and a plurality of quantum well layers; and
    a p-type nitride semiconductor layer provided on the active layer,
    wherein each of the quantum barrier layers comprises two $In_xGa_{(1-x)}N$ layers (0<x<1) having energy band gaps larger than the quantum well layers and at least three $Al_yGa_{(1-y)}N$ layers (0≦y<1) having energy band gaps larger than the two $In_xGa_{(1-x)}N$ layers, the at least three $Al_yGa_{(1-y)}N$ layers is are stacked between the two $In_xGa_{(1-x)}N$ layers and the two $In_xGa_{(1-x)}N$ layers are outermost layers of each of the quantum barriers and are adjacent to two of the plurality of quantum well layers and
    wherein the plurality of quantum well layers are formed of $In_zGa_{(1-z)}N$ (0<x<z<1),
    each of the two $In_xGa_{(1-x)}N$ layers and the at least three $Al_yGa_{(1-y)}N$ layers forming the quantum barrier layer has a thickness of 0.5 to 10 nm, and a first one of the at least three $Al_yGa_{(1-y)}N$ layers has a larger bandgap than that of a second one of the at least three $Al_yGa_{(1-y)}N$ layers that is closer to the quantum well layers than the first one of the at least three $Al_yGa_{(1-y)}N$ layers.

2. The nitride semiconductor light emitting device of claim 1, wherein each of the $In_xGa_{(1-x)}N$ layers and the $Al_yGa_{(1-y)}N$ layers forming the quantum barrier layer has a thickness of 0.3 to 3 nm.

3. The nitride semiconductor light emitting device of claim 1, wherein the quantum barrier layer has a thickness of 2 to 15 nm.

4. The nitride semiconductor light emitting device of claim 1, wherein the quantum well layer has a thickness of 1 to 15 nm.

* * * * *